(12) United States Patent
Berger et al.

(10) Patent No.: US 8,218,349 B2
(45) Date of Patent: Jul. 10, 2012

(54) NON-VOLATILE LOGIC DEVICES USING MAGNETIC TUNNEL JUNCTIONS

(75) Inventors: Neal Berger, Cupertino, CA (US); Mourad El Baraji, Saint Martin d'Heres (FR)

(73) Assignee: Crocus Technology SA, Grenoble Cedex (FR)

(*) Notice: Subject to any disclaimer, the term of this patent is extended or adjusted under 35 U.S.C. 154(b) by 271 days.

(21) Appl. No.: 12/784,848

(22) Filed: May 21, 2010

(65) Prior Publication Data
US 2010/0302832 A1 Dec. 2, 2010

(30) Foreign Application Priority Data

May 26, 2009 (EP) ..................................... 09290387

(51) Int. Cl.
*G11C 11/00* (2006.01)
(52) U.S. Cl. ........................................ 365/148; 365/158
(58) Field of Classification Search .................. 365/148, 365/158
See application file for complete search history.

(56) References Cited

U.S. PATENT DOCUMENTS
6,191,973 B1 * 2/2001 Moyer ........................ 365/173
* cited by examiner

*Primary Examiner* — Jason Lappas
(74) *Attorney, Agent, or Firm* — Pearne & Gordon LLP (57) ABSTRACT

The present disclosures concerns a register cell comprising a differential amplifying portion containing a first inverter coupled to a second inverter such as to form an unbalanced flip-flop circuit; a first and second bit line connected to one end of the first and second inverter, respectively; and a first and second source line connected to the other end of the first and second inverter, respectively; characterized by the register cell further comprising a first and second magnetic tunnel junction electrically connected to the other end of the first and second inverter, respectively. The shift register disclosed herein can be made smaller than conventional shift registers and power consumption during the write and read operation of the shift registers can be low. The shift register disclosed herein can be made smaller than conventional shift registers and power consumption during the write and read operation of the shift registers can be low.

15 Claims, 6 Drawing Sheets

(Prior art)

NON-VOLATILE LOGIC DEVICES USING MAGNETIC TUNNEL JUNCTIONS

FIELD

The present disclosure generally relates to program registers and a programmable logic circuit, such as flip-flops, shift registers and the like. The present disclosure relates more specifically to a technology for storing data or performing a logic operation on the program registers.

BACKGROUND

Reduction of power consumption and the increase of high speed data operation are the major targets for the next generation logic circuit. Drastic increase of static power dissipation is being anticipated due to leakage current in nanometer-scaled CMOS technology. In addition, increase in the length of global interconnection in advanced VLSIs results in further increase of both power and delay. Logic-in memory architecture, where memory elements are distributed over a logic-circuit plane, combined with nonvolatile memory is expected to realize both ultra-low power and shorten interconnection delay. However, in order to fully take advantage of the logic-in-memory architecture, it is important to implement a non-volatile memory that has a capability of shorter access time, unlimited endurance, scalable write, and small dimension comparable to the employed CMOS technology.

As a result there is a surge of innovative development in low power devices and design techniques. In most cases, the requirements for low power consumption must meet the equally demanding goals of high chip density and high throughput circuits. Hence, low power digital design and digital ICs are very active fields of research and development. These fields have contributed to the rise of power as a major design parameter on par with performance and die size. In fact, power consumption is regarded as the limiting factor in the continuing scaling of CMOS technology. To respond to this challenge, a memory technology that combines higher density with non-volatility and reduced power consumption in a cost-effective manner can prove desirable and provide a basis for a wide range of data applications.

Embedded SRAMs is one of the most frequently used memory embedded in logic chips, and typical applications include on-chips buffers, caches, register files, and so on. The small access time makes it popular in the logic ICs industry. Nonetheless, its volatility and the need of an external non-volatile memory to store the configuration data make it not suitable for nowadays embedded applications. Indeed, in embedded FPGA devices, the use of a nonvolatile internal memory like flash technology allows the chip to be powered down in the standby mode when not in use in order to reduce power consumption. Indeed, these FPGAs use flash memory in there configuration layer which makes it ready to run at power up. However, distribution of the memory all over the chip raises some technological constraints and needs additional masks (10 to 15 for flash technology) and dedicated process steps thereby increasing the chip cost. Moreover, these FPGAs are not fast reprogramming speed due to the high-access time inherent to the flash memory.

There are a number of conventional methods for decreasing power consumption. These include "clock gating," in which the circuit clock is stopped when arithmetic processing is not being performed, and "power gating," in which power is shut down to circuits not performing operational processing. However, with clock gating, it is not possible to stop leakage current in the circuit, reducing the power-saving effects, and with power gating, although most of the leakage current can be stopped by shutting off power, it cannot be completely eliminated due to the need for power to be supplied to the register. In contrast, with nonvolatile logic technology power can but shut off to the circuit, including for the register, making it possible to reduce power consumption to zero.

An alternative is to adjust the SRAM cells to integrate a nonvolatile (nv) component. Several nv-SRAM technologies have been proposed integration non-volatile components (type flash) to the SRAM cell. But the more mature and more reliable architecture use no less than 12 transistors per cell, which has a strong impact on the density and cost. Furthermore, writing/erasing voltages of Flash are high and not very compatible with supply voltages of SRAM cells, which impose additional devices. Finally, these technologies have a low endurance (<1E10) and they are poorly suited for applications such as cache memory (embedded memory in logic ICs devices) and can ensure a fair backup at very low frequencies.

The use of nonvolatile memories such as MRAMs helps to overcome the drawbacks of classical SRAM-based logic ICs without significant speed penalty. Besides its advantage that lies in power saving during the standby mode, it also benefits to the configuration time reduction since there is no need to load the configuration data from an external nonvolatile memory as used in SRAM based logic ICs. Furthermore, during the circuit operation, the MRAM devices can be written which allows a dynamic (or shadowed) configuration and further increases the flexibility of Logic ICs circuit based on the MRAM. On the other hand, MRAM memories have shown interesting features that include high-timing performance, high-density integration, reliable data storage, good endurance, and low number of additional masks for the magnetic postprocess (The integration of MRAM devices is made by an "above-CMOS" technology (the magnetic back-end process can be done after the CMOS front-end process)).

Non-volatile registers are a data storage circuits which retain stored information in the absence of power. In digital processing (logic) circuits the storage area used to temporarily retain mid-calculation data, arithmetic processing, or operational status is called a register. Generally, registers are dispersed within the logic circuit. Logic ICs (i.e. CPUs) and Field Programmable Gate array (FPGA), contain this kind of registers, which temporarily retain the status of various processes, background information, and the operational status of other ICs and peripheral equipment. Conventional logic ICs are volatile, meaning shutting off power to the IC will cause information in the register to be lost. Therefore, power must constantly be supplied to the IC.

Figure 1:
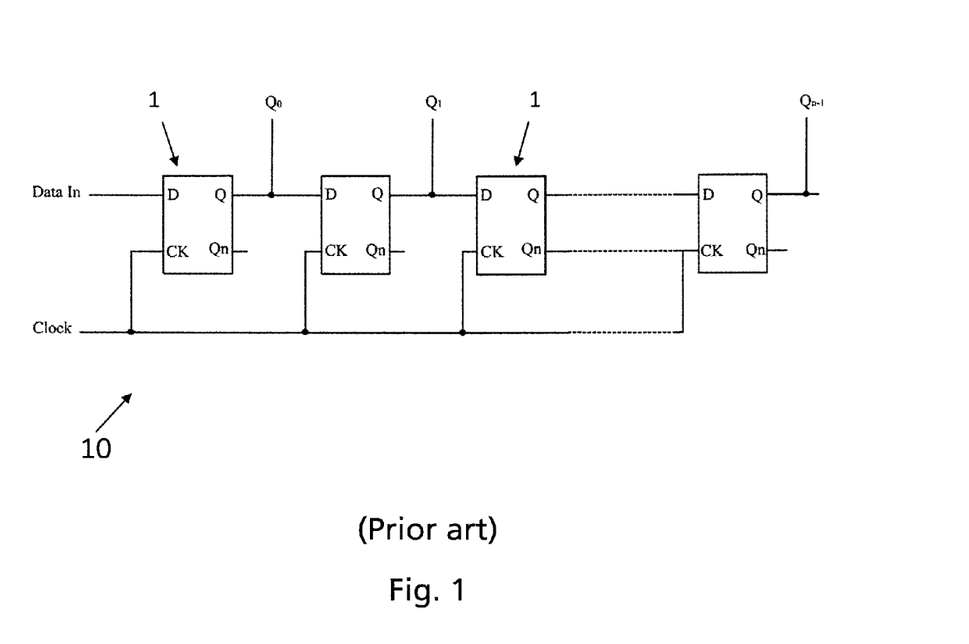
FIG. 1 shows a conventional simplified block diagram of an n-bit serial-in-parallel-out (SIPO) register.

Turning now to FIG. 1, a simplified block diagram of an n-bit serial-in-parallel-out (SIPO) register 10 is illustrated. Register include a plurality of register cells 1, each of which has input D, a clock input CK, data output Q and inverse data QN.

These are the simplest kind of shift register. The data string is presented at 'Data In', and is shifted right one stage each time 'Data Advance' (clock signal) is brought high. At each advance, the bit on the far left (i.e. 'Data In') is shifted into the first flip-flop's output. The bit on the far right (i.e. 'Data Out') is shifted out for a read operation and can be lost. As a data string is clocked to the register, any bytes or word stored in the register is simultaneously read in parallel at data outputs Qi. As understood by those skilled in the art, these kinds of registers are most commonly used as a serial distributed memory or a bit stream.

SUMMARY

The present application discloses a register cell which overcome at least some limitations of the prior art.

According to the embodiments, a register cell can comprise a differential amplifying portion containing a first inverter coupled to a second inverter such as to form an unbalanced flip-flop circuit; a first and second bit line connected to one end of the first and second inverter, respectively; and a first and second source line connected to the other end of the first and second inverter, respectively; characterized by the register cell further comprising a first and second magnetic tunnel junction electrically connected to the other end of the first and second inverter, respectively.

In an embodiment, said first inverter comprises a first PMOS transistor connected in series with a NMOS transistor and the second inverter comprises a second PMOS transistor connected in series with a second NMOS transistor.

In another embodiment, the gates of the first transistors and are coupled to the drain of the second transistors and source of the second transistors, respectively.

In yet another embodiment, the first and second bit lines are connected to the first and second transistors, respectively.

In yet another embodiment, one end of the first and second magnetic tunnel junction is connected to the first NMOS transistor and to the drain of the second NMOS transistor, respectively.

In yet another embodiment, the first source line and a second source line connect the other end of the first and a second magnetic tunnel junction, respectively.

In yet another embodiment, the first and second magnetic tunnel junction are connected, respectively, between the drain of the first PMOS and NMOS transistors and the drain of the second PMOS and NMOS transistors.

In yet another embodiment, the first and second magnetic tunnel junction are arranged to have opposite resistance values.

In yet another embodiment, the first and second magnetic tunnel junction are formed from a reference layer having a fixed magnetization and a storage layer having a magnetization direction that can be switched from a first stable direction to a second stable direction.

The present disclosure also concerns a shift register which overcome at least some limitations of the prior art, wherein the shift register can comprise a plurality of the register cells; each register cell being connected in series to the adjacent register cell via a shift transistor used to chain together the two inverters of the adjacent register cells and to shift data from one node of one register cell to one node of the adjacent register cell.

In an embodiment, the shift register further comprises a clock line adapted to generate clock signal such as to shift a data stored in the second inverter of one of the register cells to the first inverter of the first inverter of the adjacent successive register cell, during a shift operation.

In another embodiment, the shift register further comprises a field line adapted to pass a field current and arranged such as a external magnetic field generated by the field current can address simultaneously all magnetic tunnel junctions of the register cells.

The present disclosure also pertains to a method for writing the shift register comprising:

selecting the magnetic tunnel junctions having the same magnetic state;

heating the selected magnetic tunnel junctions;

once the selected magnetic tunnel junctions has reached a the predetermined high threshold temperature, changing the magnetic state of the selected magnetic tunnel junctions.

In an embodiment, said heating comprises passing a heating current 31 through the selected magnetic tunnel junctions using the stored data in the adjacent register cell.

In another embodiment, said changing the magnetic state comprises passing the field current in the field line.

In yet another embodiment, said changing the magnetic state comprises passing a CIMS current through the selected magnetic tunnel junctions.

The shift register disclosed herein can be made smaller than conventional shift registers and power consumption during the write and read operation of the shift registers can be low.

BRIEF DESCRIPTION OF THE DRAWINGS

The preferred embodiments will be better understood with the aid of the description of an embodiment given by way of example and illustrated by the figures, in which.

DETAILED DESCRIPTION OF THE PREFERRED EMBODIMENTS

Figure 2:
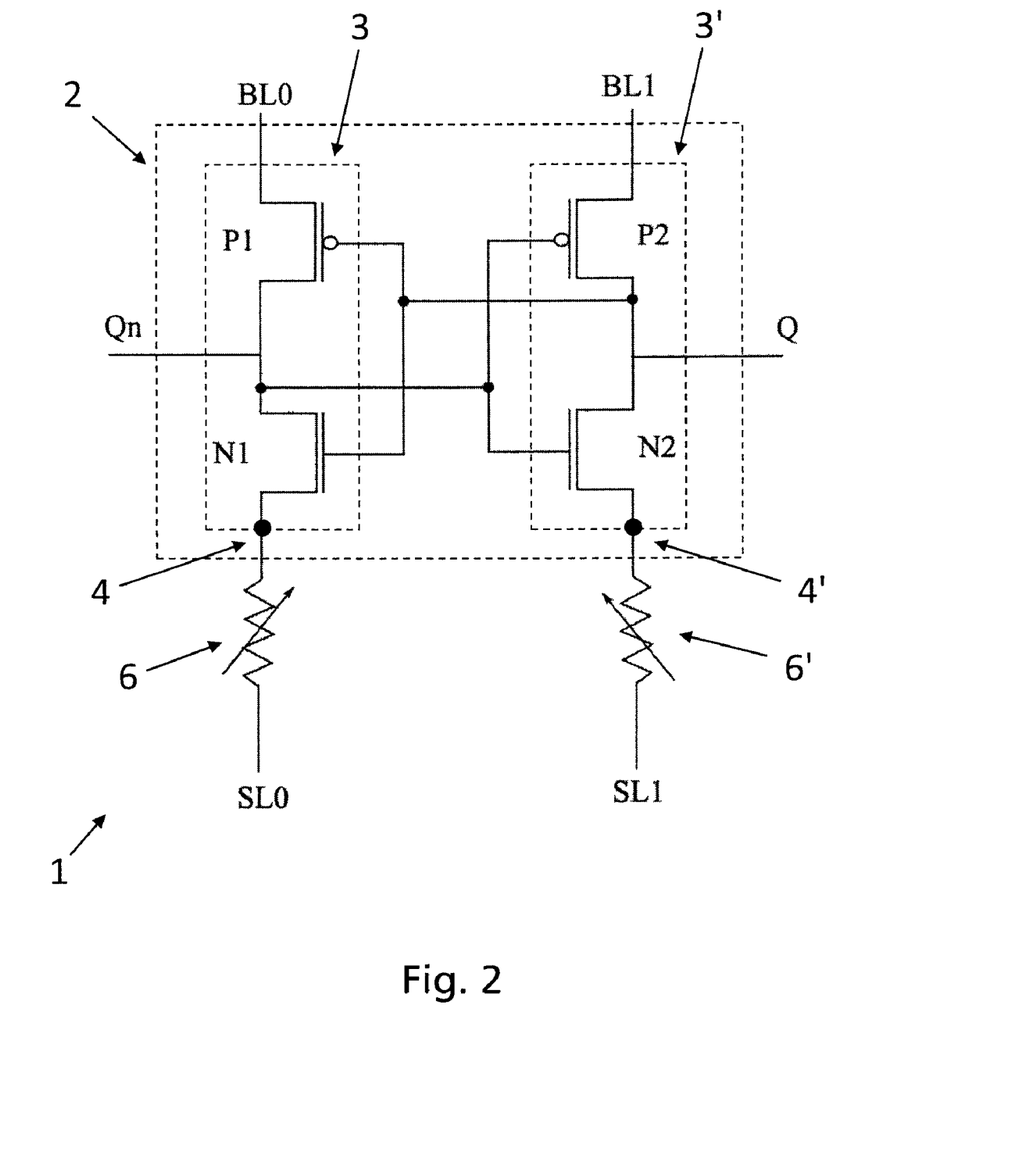
FIG. 2 illustrates a register cell based on unbalanced flip-flop according to an embodiment.

FIG. 2 illustrates a non-volatile unbalanced register cell 1 according to an embodiment. The register cell 1 comprises cross coupled first and second inverter 3, 3' forming an unbalanced flip-flop circuit. The first and second inverters 3, 3' comprise respectively a first PMOS transistor P1 connected in series with a NMOS transistor N1, and a second PMOS transistor P2 connected in series with a second NMOS transistor N2. The gates of the first transistors P1 and N1 are coupled to the drain of the second transistors P2 and source of the second transistors N2, respectively. The sources of the first and second transistors P1 and P2 and connected to a first bit line $B_{L0}$, and a second bit line $B_{L1}$, respectively.

A first and a second magnetic tunnel junction, respectively represented by the resistance 6 and 6' in FIG. 2, are connected at one end respectively to the first inverter 3, via the drain of the first NMOS transistor N1 (represented as node 4 in FIG. 2), and to the second inverter 3', via the drain of the second NMOS transistor N2 (represented as node 4' in FIG. 2). The two magnetic tunnel junctions 6, 6' can be arranged to have opposite resistance values, for example a maximum and a minimum resistance value, respectively, coding one logic bit. Here, the two inverters 3, 3', forming a CMOS preamplifier, act as a 1-bit analog to digital converter (ADC), converting the differential resistance, or the difference between the first and second resistance of the first and second magnetic tunnel junction 6, 6', to a so call rail-to-rail voltage (binary information). A first source line $S_{L0}$ and a second source line $S_{L1}$ connect the other side of the first and second inverters 3, 3' to the drain of the first and second NMOS transistor sN1, N2, respectively, via the other end of the first and a second magnetic tunnel junction 6, 6', respectively.

In a variant of the embodiment not represented, the magnetic tunnel junction 6, 6' can be formed from a reference layer having a fixed magnetization, a storage layer having a magnetization direction that can be switched from a first stable direction to a second stable direction upon writing of the cell, and an insulating layer between the storage layer and the sense layer. The magnetic state of the magnetic tunnel junction 6, 6' is defined by the relative orientation of the reference and storage layer magnetization.

Upon start-up of the register cell 1, a voltage is applied to the first and second bit line $B_{L0}$, $B_{L1}$ (signals go high) and, depending on the resistance values of the first and second magnetic tunnel junctions 6, 6', an input of the first inverter 3, represented by the node Q in FIG. 2, is pulled high ($V_{DD}$), while an output of the second inverter 3', represented by the node Qn in FIG. 2, is pulled down (0 V). The register cell 1 is formed from a differential amplifying portion 2, or CMOS volatile stage, comprising the two inverters 3, 3', and a magnetic nonvolatile stage portion, comprising the two magnetic tunnel junctions 6, 6'. In this configuration, the register cell 1 allows for a dual storage volatile and nonvolatile facility.

Figure 3:
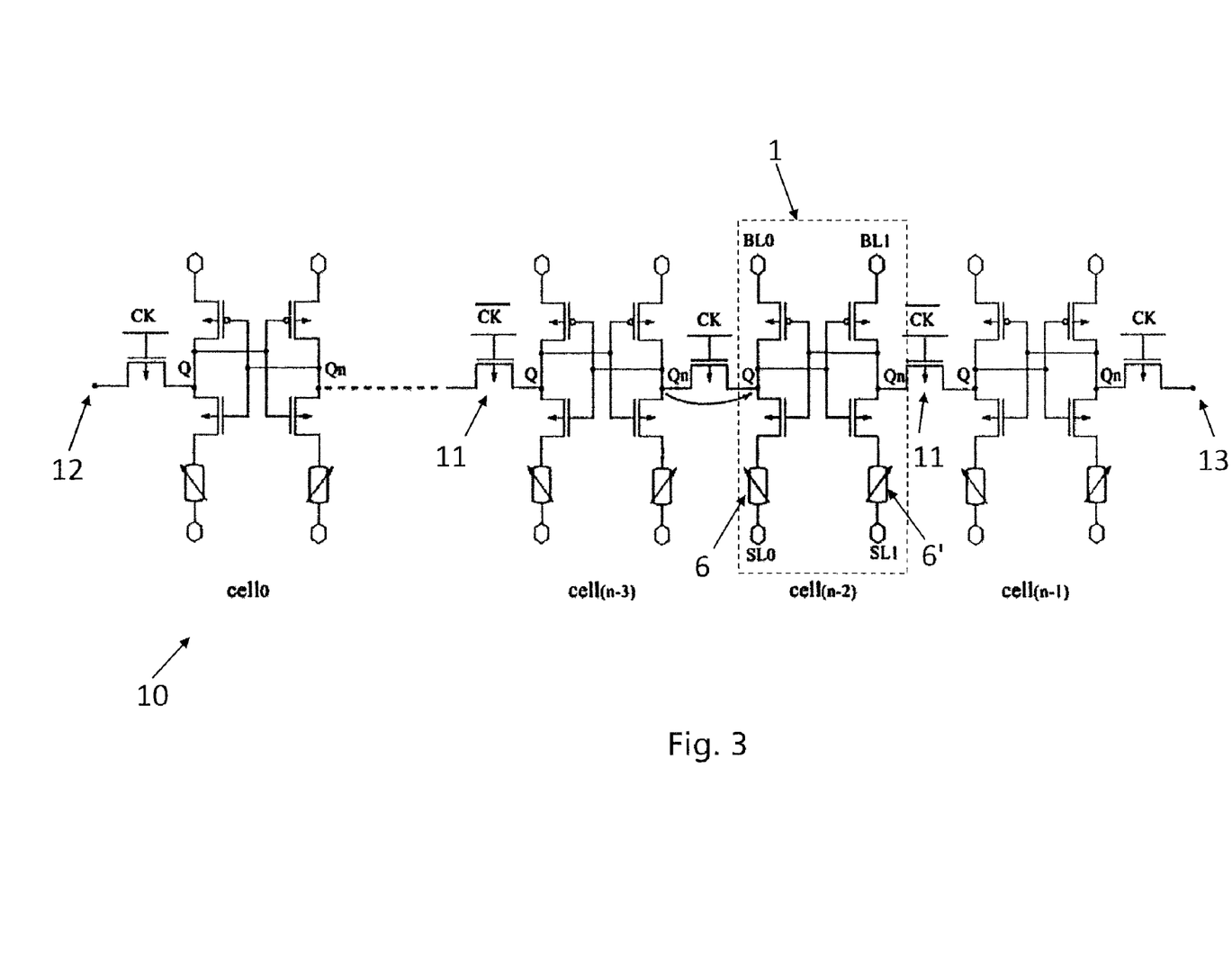
FIG. 3 illustrates a non-volatile magnetic shift register according to an embodiment.

Referring to FIG. 3, a block/schematic diagram of a nonvolatile magnetic shift register 10 is illustrated according to an embodiment. The shift register 10 includes a plurality of the register cells 1 according to the embodiment of FIG. 2. In FIG. 3, the succession of register cells 1 is indicated by the symbol "n-i", with the first and last register cells 1 of the shift register 10 being indicated by the symbols "0" and "n-1", respectively. Each register cell 1 of the magnetic shift register 10 is connected in series to an adjacent register cell 1, via a shift transistor 11. The shift transistor 11 is used to chain together the two inverters 3, 3' of the adjacent register cells 1 and to shift data from one of the input and output nodes Q, Qn of one of the register cells 1 to the one of the input and output nodes Q, Qn of the adjacent register cell 1.

A clock line, indicated with the symbol CK in FIG. 3, is adapted to generate clock signal comprising repetitive alternating ones and zeros or continuous alternating square wave. During a shift operation (represented as going from left to right in FIG. 3), the side of the second bit line BL1 of one of the cell registers 1, for example "n-3", is at $V_{DD}$ and the side of the first bit line $B_{L0}$ of the adjacent cell register 1, "n-2", is at 0V. In the case the clock signal generated by the clock line CK has a value corresponding to one, the data stored in the second inverter 3' and outputted at the output node Qn is shifted through the shift transistor 11 to the first inverter 3 of the adjacent register cell 1, via its input Q.

In the shift register 10, bits of information are applied serially to a data input, shown by node 12 in FIG. 3, of the first register cell 1. The data is then clocked to the first register cell 1, "0", by the clock signal generated by the clock line CK applied simultaneously to the input Q of all cell registers 1, via the gate of the respective shift transistor 11. In FIG. 3, the symbol $\overline{CK}$ represents "not CK", or the clock lines $\overline{CK}$ applying a clock signal inverse of the clock signal applied by the clock lines CK. As one of the bits is clocked into the first cell register 1 ("0"), the other bits stored in the subsequent cell registers 1 are simultaneously clocked into the next adjacent cell register 1 or clocked out of last register 1 ("n-1") via its data output 13.

Figure 4:
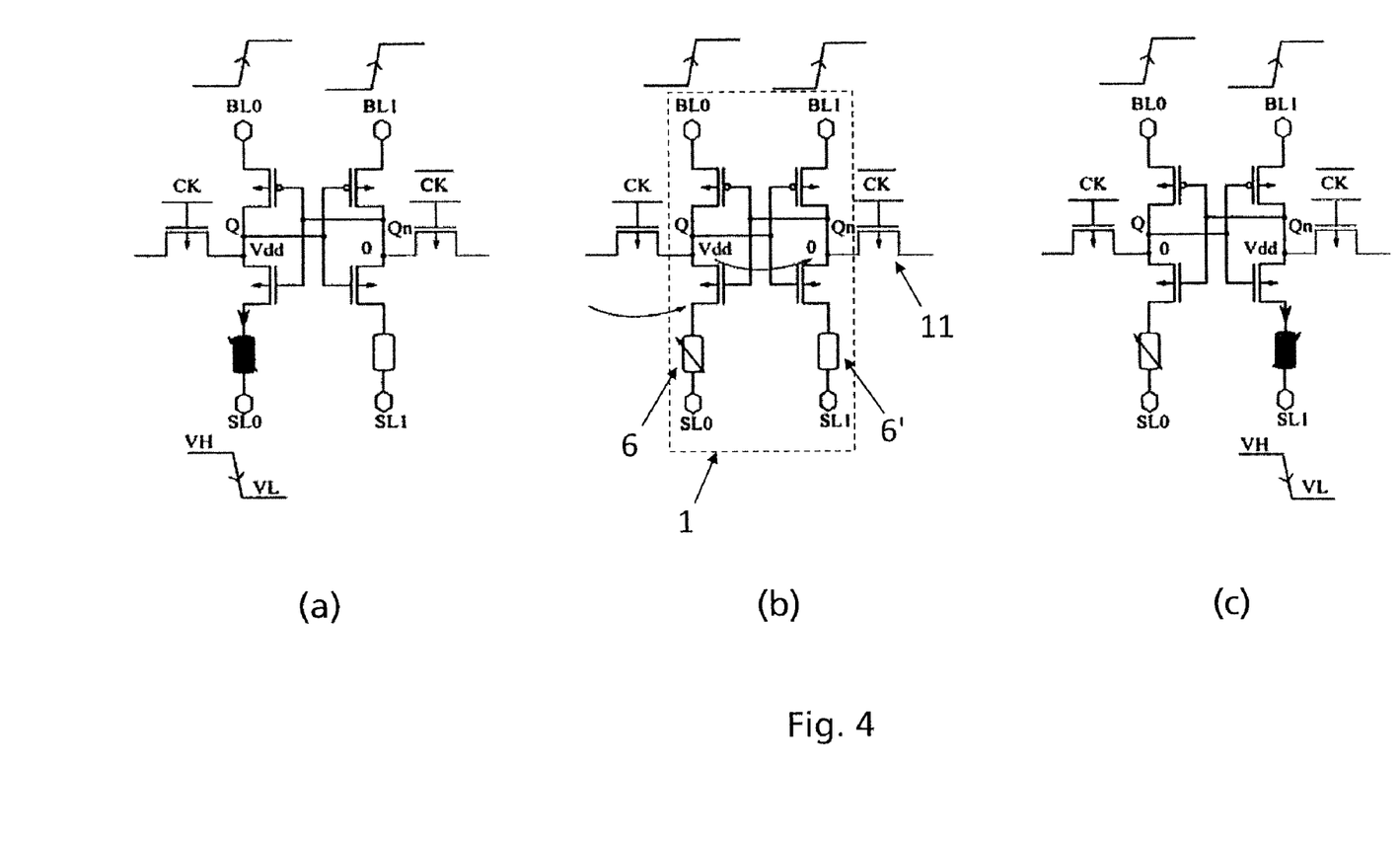
FIG. 4 represents a register cell writing according to an embodiment.

FIG. 4a to c illustrates schematically a writing operation of the non-volatile shift register 10 for a single memory register cell 1, according to an embodiment. More particularly, the writing operation is based on a thermally assisted switching (TAS)-based writing operation where the magnetic tunnel junction 6, 6' is heated at a predetermined high threshold temperature in order to switch the magnetization of the storage layer.

Prior to the writing operation, magnetic tunnel junctions 6, 6' having the same magnetic state in the shift register 10 are selected by shifting an information sequence data such as to have a high voltage $V_{DD}$ at the corresponding input and/or output Q, Qn, of the register cells 1. Here, the same magnetic state means a low resistance value, where the magnetizations of the storage and reference layers are parallel, or a high resistance value where the magnetizations of the storage and reference layers are antiparallel.

An exemplary first writing step of the writing operation is represented in FIG. 4a for one of the register cell 1 having a selected first magnetic tunnel junction 6. During the first writing step, the first magnetic tunnel junction 6 is heated by passing a heating current 31 by using the stored data in the register cell 1. More particularly, when the voltage $V_{DD}$ is applied at the input Q, the signal of the first source line $S_{L0}$ goes low (VL) such as to have enough voltage across the first transistor N1 and the magnetic tunnel junction 6 such that the heating current 31 passing through the magnetic tunnel junction 6 is high enough to heat the magnetic tunnel junction 6 to the predetermined high threshold temperature. Here, the heating current pulse 31 is controlled via the first source line $S_{L0}$. For example, the high threshold temperature can corresponds to a blocking temperature of about 150° C. of an antiferromagnetic layer (not shown) pinning the storage layer. Once the first magnetic tunnel junction 6 has reached the predetermined high threshold temperature, an external magnetic field is applied to the magnetic tunnel junction 6 such as to change switch the magnetization direction of the storage layer.

In a variant of the embodiment not represented, the external magnetic field is generated by passing a field current through a field line arranged such as the generated external magnetic field can address simultaneously all of the selected magnetic tunnel junctions 6, 6 and switch the magnetization of their storage layer in a direction according the external magnetic field. The external magnetic field must be higher than the coercitivity of the storage layer to switch its magnetization direction. The shared field line perform a low power writing operation since a two step current pulse can be used to write all magnetic tunnel junctions 6, 6'. Performing the writing operation with the two step current pulse means that a low and high resistance value is sequentially written in the magnetic tunnel junctions 6, 6'.

The heating current 31 is then turned off in order to cool the magnetic tunnel junction 6 at a low threshold temperature to freeze the magnetization of the storage layer in the written state. Turning off the heating current 31 is performed by setting the first selection source line $S_{L0}$, in a high level mode (VH). The field current can maintained during the cooling of the magnetic tunnel junctions 6 and then switched off, once the magnetic tunnel junction 6 have reached the low threshold temperature. After completing the first writing step, the resistance of the first magnetic tunnel junction 6 is changed from a low to a high value, or a high to a low value, depending on the relative orientation of the storage layer and reference layer magnetizations, prior and after the first writing step.

In a second step shown in FIG. 4b, the shift register 10 is clocked once.

In a third writing step shown in FIG. 4c, the second magnetic tunnel junctions 6' is written in a complementary way after the shift register 10 has been clocked in the second step. Here, the expression written in a complementary way means that the second magnetic tunnel junciton 6' is written such as to have its resistance value opposite to the one of the first magnetic tunnel junction 6. During the third writing step, the writing operation is the same as the one described in the first step. However, the field current is passed in the field line with a polarity opposite to the one during the writing operation in the first step.

The writing operation outlined in FIGS. 4a to 4c could equally have been described with the second and first magnetic tunnel junction 6', 6 being written in the first and third writing steps, respectively. In that case, the voltage $V_{DD}$ is applied at the output Qn and the signal of the second source line $S_{L1}$ is set to VL such as to have enough voltage across the second transistor N2 to pass the heating current 31 passing through the second magnetic tunnel junction 6'.

During a read operation (not shown), the bit lines BL0, BL1 are set at a high voltage $V_{DD}$ and the register cell 1 pre-amplifies locally the data stored magnetically in the two magnetic tunnel junctions 6, 6'. The data can then be read at the input Q, or output Qn, of the register cell 1 by shifting until the data output the node Qn for the read operation. The read operation allows for reading data bit by bit, or by block of bits, depending of the read circuit at the end of shift register 10.

Figure 5:
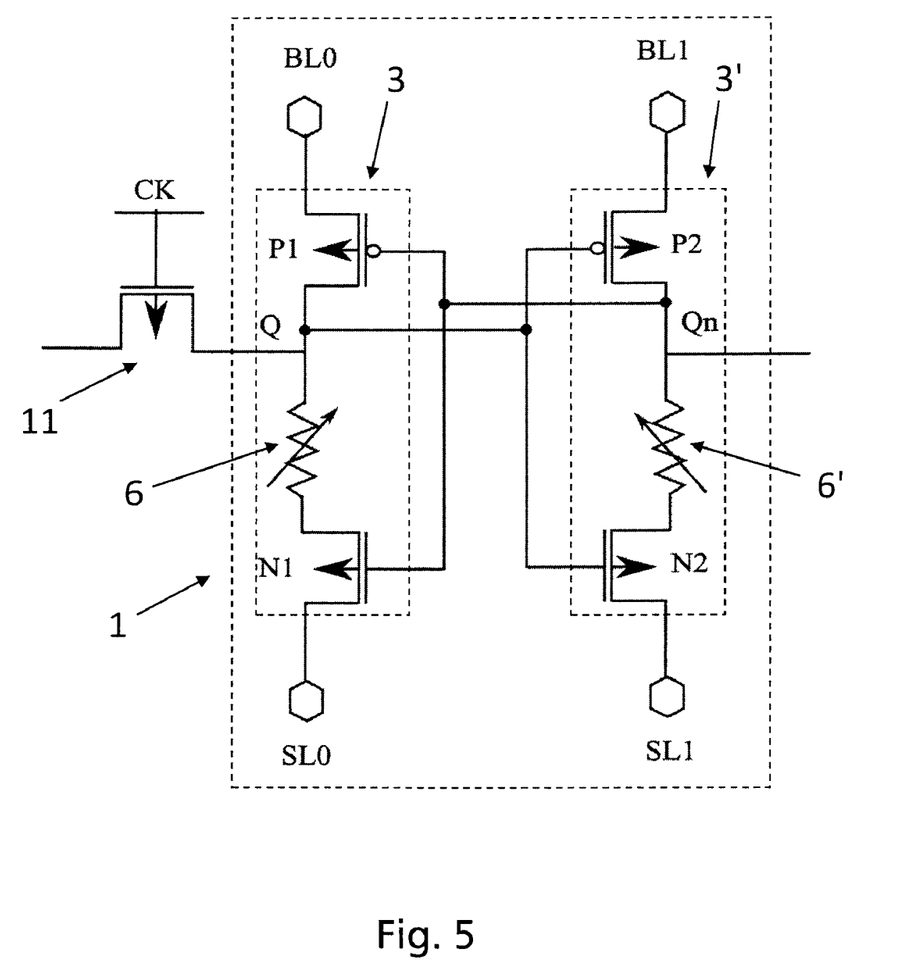
FIG. 5 shows a magnetic shift register cell according to another embodiment.

FIG. 5 represents the non-volatile register cell 1 in another embodiment. In this configuration, the first and second magnetic tunnel junctions 6, 6' are disposed, respectively, between the drain of the first PMOS and NMOS transistors P1, N1, and the drain of the second PMOS and NMOS transistors P2, N2. Here, the register cell 1 can be connected in series to other identical register cells 1 in order to form the non-volatile shift register 10, as described above. The start-up and the writing operation can be performed as described above.

The writing operation of the register cell 1 can also be performed by using a spin polarized (STT) current or by using an induced magnetic switching (CIMS) current, instead of the field current. The STT or CIMS current can also be combined with the TAS.

According to another embodiment not represented, the writing operation of the register cell 1 is performed by using an induced magnetic switching (CIMS) current in combination with the TAS. Here, the writing operation is similar to the one describe above in the embodiment of FIGS. 4a to 4c, but no external magnetic field is used. Instead, the CIMS current pulse is passed through the magnetic tunnel junction 6, 6' to change its magnetic state in accordance with the CIMS current polarization. Here, the CIMS current is passed through the magnetic tunnel junction 6, 6' being heated at the predetermined high threshold temperature. The CIMS current can be appropriately spin-polarized by adding one or several specific magnetic layers, for example, magnetic layers having a perpendicular magnetization in the magnetic tunnel junction 6, 6', as described in U.S. Pat. No. 6,603,677.

The feasibility of a writing operation of a magnetic tunnel junction using the CIMS current has been experimentally demonstrated for metallic low sized (<100 nm) structures (see reference: Science, volume 285, page 867, 1999). In U.S. Pat. No. 5,695,864, a precession or even a reversing of the magnetization of a magnetic layer with an adjustable magnetic orientation was induced by the CIMS current. The precession was obtained by a transfer process of the angular spin moment between polarized carriers and the magnetic moment of the layer. Combining the CIMS-based writing operation with the TAS has been described in U.S. Pat. No. 6,950,335 for of a MRAM-based memory.

Performing the writing operation using the STT or CIMS currents is highly scalable since the STT or CIMS currents scales with the area of the magnetic tunnel junction 6, 6'. Furthermore, the writing operation using the STT or CIMS currents is potentially very fast and the register cell 1 does not require the additional field line to generate the external magnetic field, hence reducing both the size of the register cell 1 and the corresponding driver overhead. Moreover, the CIMS-based writing operation combined with the TAS allows for reduced write power consumption, particularly with small feature sizes. The readout remains similar to the one in the magnetic field-driven shift register architecture.

Figure 6:
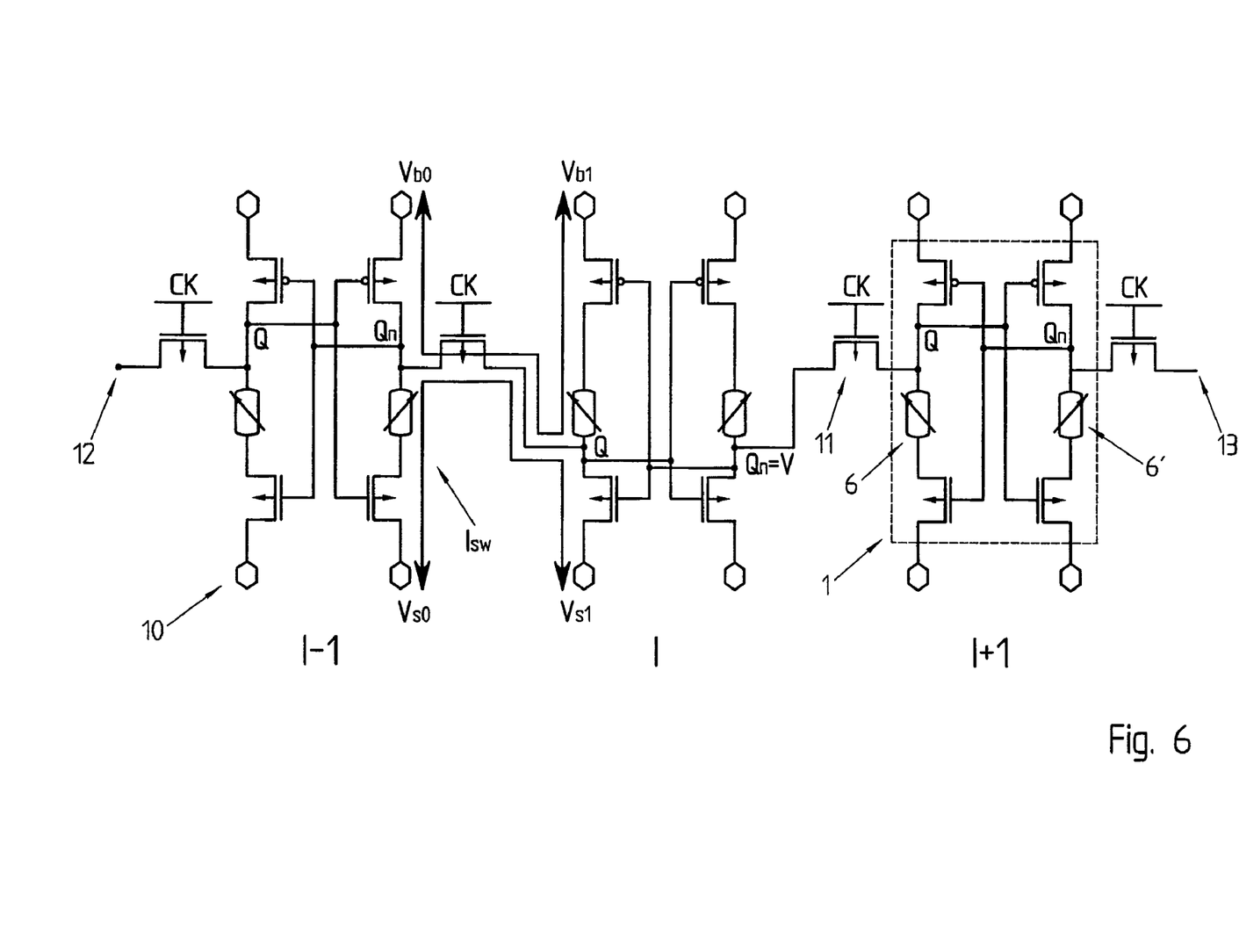
FIG. 6 illustrates a shift register CIMS-based writing operation according to another embodiment.

FIG. 6 shows the shift register 10 comprising a plurality of the register cells 1 according to the embodiment of FIG. 5. More particularly, three adjacent register cells 1 successively indicated by the symbols "I−1", "I" and "I+1" are represented in FIG. 6. The adjacent register cells 1 are arranged such that a bidirectional current $I_{sw}$ flows through all magnetic tunnel junctions 6, 6'.

In the example of FIG. 6, during the initial step of the writing operation, the bidirectional current $I_{sw}$ is made to flow from the node $V_{S1}$ to the node $V_{S0}$ by pulling up the node $V_{S1}$ to a high value and by pulling down the node $V_{S0}$ to ground. This enables changing the magnetic state of the second magnetic tunnel junctions 6' of the register cell 1 indicated by "I−1", for example, by switching the magnetization of the storage layer to a direction parallel or antiparallel of that of the reference layer. In this configuration, the register cell 1 "I" stores a value "0" at its input Q and a value $V_{DD}$ at its output Qn and the register cell 1 "I−1" stores a value $V_{DD}$ at its input Q and a value "0" at its output Qn. By passing the bidirectional current $I_{sw}$ in the opposite direction, the reverse value will be stored at input Q and output Qn of the register cells 1 "I" and "I−1", respectively. Here, passing the bidirectional current $I_{sw}$ in the opposite direction is performed by inversing the polarization of $V_{S0}$ and $V_{S1}$, and by shifting the information by one clock cycle. The second magnetic tunnel junction 6' can be written in the same manner by passing the bidirectional current $I_{sw}$ through it, and changing the polarization of the bit lines $V_{B0}$ and $V_{B1}$.

The shift register 10 disclosed herein comprises only five transistors N1, N2, P1, P2, 11 per register cell 1. The four transistors N1, N2, P1, P2 being used for the register cell 1 and to convert the analog resistance variation of the two magnetic tunnel junctions 6, 6' to a rail-to-rail data at the output Qn of the register cell 1. The fifth transistor, or shift transistor 11, is used to shift data from one of the register cells 1 to the adjacent register cell 1. Since the transistors N1, N2, P1, P2, 11 can be small, indeed, the smallest size for a given technology can be used, power consumption during the write and read operation can be low. Moreover, the surface area of the shift register 10 can also be small.

The shift register 10 according to the embodiments can also be used as a hybrid register cell. More particularly, since the magnetic tunnel junctions 6, 6' are integrated directly on circuits, a type of integration commonly known as "Above IC", they can be optionally implemented on the shift register 10 using extra magnetic masks. Consequently, the non-volatile magnetic elements, or the two magnetic tunnel junctions 6, 6', can be added to a standard shift register in a same process flow to obtain the shift register 10 according to the above embodiments.

REFERENCE NUMBERS AND SYMBOLS 1 register cell
2 differential amplifying portion
3 first inverter
3' second inverter
4 first node
4' second node 6 first magnetic tunnel junction
6' second magnetic tunnel junction
10 shift register
11 shift transistor
12 data input
13 data output
31 heating current
BL0 first bit line
BL1 second bit line
CK clock line
Isw bidirectional current
N1 first NMOS transistor
N2 second NMOS transistor
N3 third NMOS transistor
P1 first PMOS transistor
P2 second PMOS transistor
Q input node
Qn output node
SL0 first source line
SL1 second source line
$V_{DD}$ high voltage
VH high level mode

The invention claimed is:

1. A register cell comprising:
a differential amplifying portion containing a first inverter coupled to a second inverter such as to form an unbalanced flip-flop circuit;
a first and second bit line connected to one end of the first and second inverter, respectively; and
a first and second source line connected to the other end of the first and second inverter, respectively; wherein
the register cell further comprising a first and second magnetic tunnel junction electrically connected to the other end of the first and second inverter, respectively.

2. The register cell according to claim 1, wherein said first inverter comprises a first PMOS transistor connected in series with a NMOS transistor and the second inverter comprises a second PMOS transistor connected in series with a second NMOS transistor.

3. The register cell according to claim 2, wherein the gates of the first transistors and are coupled to the drain of the second transistors and source of the second transistors, respectively.

4. The register cell according to claim 2, wherein one end of the first and second magnetic tunnel junction is connected to the first NMOS transistor and to the drain of the second NMOS transistor, respectively.

5. The register cell according to claim 4, wherein the first source line and a second source line connect the other end of the first and a second magnetic tunnel junction, respectively.

6. The register cell according to claim 2, wherein the first and second magnetic tunnel junction are connected, respectively, between the drain of the first PMOS and NMOS transistors and the drain of the second PMOS and NMOS transistors.

7. The register cell according to claim 1, wherein the first and second magnetic tunnel junction are arranged to have opposite resistance values.

8. The register cell according to claim 1, wherein the first and second magnetic tunnel junction are formed from a reference layer having a fixed magnetization and a storage layer having a magnetization direction that can be switched from a first stable direction to a second stable direction.

9. A shift register comprising a plurality of register cells comprising a differential amplifying portion containing a first inverter coupled to a second inverter such as to form an unbalanced flip-flop circuit; a first and second bit line connected to one end of the first and second inverter, respectively; and a first and second source line connected to the other end of the first and second inverter, respectively; the register cell further comprising a first and second magnetic tunnel junction electrically connected to the other end of the first and second inverter, respectively; wherein each register cell being connected in series to the adjacent register cell via a shift transistor used to chain together the two inverters of the adjacent register cells and to shift data from one node of one register cell to one node of the adjacent register cell.

10. The shift register according to claim 9, further comprising a clock line adapted to generate clock signal such as to shift a data stored in the second inverter of one of the register cells to the first inverter of the first inverter of the adjacent successive register cell, during a shift operation.

11. The shift register according to claim 9, further comprising a field line adapted to pass a field current and arranged such as a external magnetic field generated by the field current can address simultaneously all magnetic tunnel junctions of the register cells.

12. A method for writing a shift register comprising a plurality of register cells comprising a differential amplifying portion containing a first inverter coupled to a second inverter such as to form an unbalanced flip-flop circuit; a first and second bit line connected to one end of the first and second inverter, respectively; and a first and second source line connected to the other end of the first and second inverter, respectively; the register cell further comprising a first and second magnetic tunnel junction electrically connected to the other end of the first and second inverter, respectively; wherein each register cell being connected in series to the adjacent register cell via a shift transistor used to chain together the two inverters of the adjacent register cells and to shift data from one node of one register cell to one node of the adjacent register cell; the method comprising:
selecting the magnetic tunnel junctions having the same magnetic state;
heating the selected magnetic tunnel junctions;
once the selected magnetic tunnel junctions has reached a the predetermined high threshold temperature, changing the magnetic state of the selected magnetic tunnel junctions.

13. The method according to claim 12, wherein said heating comprises passing a heating current 31 through the selected magnetic tunnel junctions using the stored data in the adjacent register cell.

14. The method according to claim 12, wherein said changing the magnetic state comprises passing the field current in the field line.

15. The method according to claim 12, wherein said changing the magnetic state comprises passing a CIMS current through the selected magnetic tunnel junctions.

* * * * *